United States Patent
Barrier, IV

(10) Patent No.: US 10,938,365 B2
(45) Date of Patent: Mar. 2, 2021

(54) VARIABLE STEP SIZE TO REDUCE CONVERGENCE TIME OF A CONTROL LOOP

(71) Applicant: MACOM Technology Solutions Holdings, Inc., Lowell, MA (US)

(72) Inventor: George L. Barrier, IV, Lowell, MA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 16/417,513

(22) Filed: May 20, 2019

(65) Prior Publication Data

US 2019/0356292 A1 Nov. 21, 2019

Related U.S. Application Data

(60) Provisional application No. 62/673,715, filed on May 18, 2018.

(51) Int. Cl.
*H03G 3/30* (2006.01)
*H04B 10/25* (2013.01)

(52) U.S. Cl.
CPC ..... *H03G 3/3084* (2013.01); *H03G 2201/103* (2013.01); *H03G 2201/50* (2013.01); *H03G 2201/70* (2013.01); *H04B 10/25891* (2020.05)

(58) Field of Classification Search
CPC ........................................................ H03G 3/30
USPC ................................................. 330/279, 278
See application file for complete search history.

(56) References Cited

U.S. PATENT DOCUMENTS

| | | |
|---|---|---|
| 5,019,769 A | 5/1991 | Levinson |
| 5,383,208 A | 1/1995 | Queniat et al. |
| 5,396,059 A | 3/1995 | Yeates |
| 5,594,748 A | 1/1997 | Jabr |
| 5,812,572 A | 9/1998 | King et al. |
| 6,494,370 B1 | 12/2002 | Sanchez |
| 6,556,601 B2 | 4/2003 | Nagata |
| 6,707,492 B1 * | 3/2004 | Itani ............ H03M 1/187 341/139 |
| 6,934,479 B2 | 8/2005 | Sakamoto et al. |
| 6,952,531 B2 | 10/2005 | Aronson et al. |
| 7,227,916 B2 | 6/2007 | Ruelke et al. |
| 7,236,108 B2 * | 6/2007 | Cheng ............ G11B 20/10009 341/59 |
| 7,265,334 B2 | 9/2007 | Draper et al. |
| 7,276,682 B2 | 10/2007 | Draper et al. |

(Continued)

*Primary Examiner* — Henry Choe
(74) *Attorney, Agent, or Firm* — Weide & Miller, Ltd.

(57) ABSTRACT

A system for controlling convergence of gain to a target value for a variable gain amplifier comprising a detector module configured to determine a magnitude value of a variable gain amplifier output. Also, part of this embodiment is a comparator module configured to compare the magnitude value to a target value and responsive to the comparison, generate an up_dn signal. A digital control module is configured to receive the up_dn signal and processes the up_dn signal to generate a control vector. One or more digital to analog converters are configured to convert the control vector to an analog control signal such that the analog control signal controls the gain of the variable gain amplifier. Various methods of operation exist for this hardware configured to improve convergence time to a target gain value while controlling the rate of change of the gain.

21 Claims, 10 Drawing Sheets

(56) References Cited

U.S. PATENT DOCUMENTS

| | | | |
|---|---|---|---|
| 7,381,935 B2 | 6/2008 | Sada et al. | |
| 7,456,690 B2 * | 11/2008 | Kocaman | H03G 3/001 |
| | | | 330/129 |
| 7,505,498 B2 | 3/2009 | Sanchez | |
| 7,701,833 B2 * | 4/2010 | Kim | G11B 20/10027 |
| | | | 369/124.11 |
| 7,734,309 B2 | 6/2010 | Chi et al. | |
| 7,949,025 B2 | 5/2011 | Olea | |
| 9,853,735 B1 | 12/2017 | Lin | |
| 2003/0165168 A1 | 9/2003 | Murata | |
| 2004/0188717 A1 | 9/2004 | Ono | |
| 2006/0098699 A1 | 5/2006 | Sanchez | |
| 2006/0126683 A1 | 6/2006 | Kang | |
| 2006/0153256 A1 | 7/2006 | Sanchez | |
| 2006/0165139 A1 | 7/2006 | Sanchez | |
| 2017/0288369 A1 | 10/2017 | Ikram et al. | |

* cited by examiner

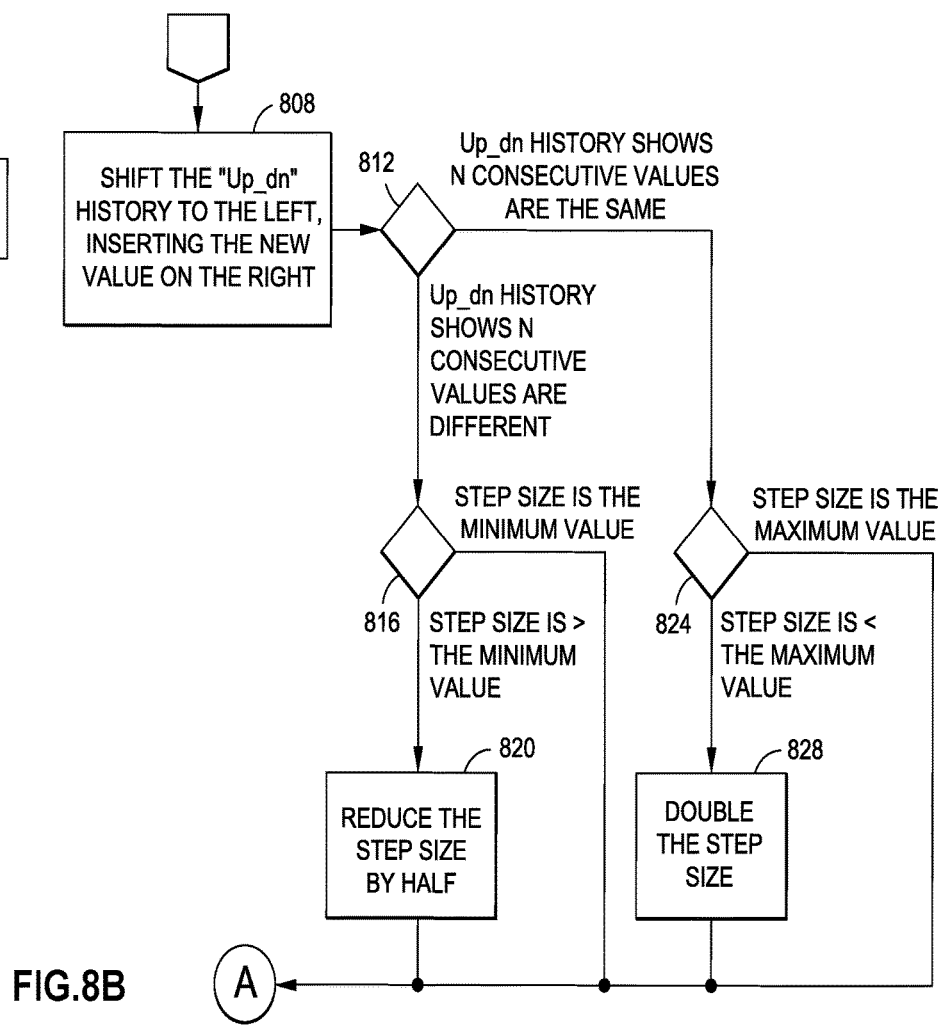

VARIABLE STEP SIZE TO REDUCE CONVERGENCE TIME OF A CONTROL LOOP

1. PRIORITY CLAIM

This application claims priority to and the benefit of U.S. Provisional Application No. 62/673,715 filed on May 18, 2018 entitled Variable Step Size to Reduce Convergence Time of Control Loop, the contents of which are incorporated by reference in its entirety herein.

2. FIELD OF THE INVENTION

The invention relates to control loop convergence, and in particular to a system and method for control loop management with variable step size.

3. RELATED ART

As part of communication between remote locations, it is required to process the received signal after the signal passes through the channel, to convert the received signal to data or other useful form. As is understood, regardless of whether the signal is an optic signal or electrical signal, passage through the channel can degrade the signal and cause it to lose power. However, a signal at a specified and known power level is required for downstream processing by other components in the communication system. This presents several challenges when receiving and processing the received signal.

One such challenge is that the power level of the received signal may be highly variable. For example, if the channel is poor or of long length, or if the signal is transmitted at a low power level, then the received signal magnitude will be small. Alternatively, the channel may be short, of high quality, or the signal may be transmitted at a high-power level, in which case the magnitude of the received signal will be high. Of course, any range of received signal magnitudes between high and low may also be received and this may change over time depending on any number of different factors including but not limited to changes in the channel, supply voltage changes, changes in installation (connected to a different channel) or a number of other factors. Regardless of the power of the received signal, it is desired to present a signal of a preferred power level (magnitude) to downstream processing element.

SUMMARY

To overcome the drawbacks of the prior art and provide additional benefits, a method for controlling convergence of an automatic gain control system is disclosed. This example method adjusts a magnitude of an input signal with a variable gain amplifier (VGA) to generate a VGA output signal. In this embodiment, the magnitude adjustment occurs based on control vector which is provided to the VGA. This method also includes processing the VGA output signal with a detector to determine a magnitude value of the VGA output signal and comparing the magnitude value to a target value. Responsive to the comparing, this method determines if the magnitude value is less than the target value. If so, then this method evaluates the magnitude value in relation to the target value to determine the difference between the magnitude value and the target value. Thereafter, this method decreases the control vector by a first amount, a second amount, or directly to a minimum control vector amount based on the evaluating the magnitude value in relation to the target value. Alternatively, responsive to the comparing determining the magnitude value is greater than the target value, evaluating the magnitude value in relation to the target value to determine the difference between the magnitude value and the target value. Thereafter, increasing the control vector by a first amount, a second amount, or directly to a maximum control vector amount based on the evaluating the magnitude value in relation to the target value.

In one embodiment, the first amount is a step size of a single step, and the second amount is a step size greater than the single step. In one configuration, the magnitude value is a peak value of the VGA output signal. This method may further comprise converting the control vector to an analog control signal such that the analog control signal is the control signal to control gain of the VGA.

Also disclosed is a system for controlling gain of a variable gain amplifier comprising a detector module configured to determine a magnitude value of a variable gain amplifier output. Also, part of this embodiment is a comparator module configured to compare the magnitude value to a target value and responsive to the comparison, generate an up_dn signal. A digital control module is configured to receive the up_dn signal and processes the up_dn signal to generate a control vector. One or more digital to analog converters are configured to convert the control vector to an analog control signal such that the analog control signal controls the gain of the variable gain amplifier.

In one embodiment, the comparator module consists of three comparators. The detector module may be configured as a peak detector configured to detect a peak value of the variable gain amplifier output. In one configuration, the digital control module comprises control logic, a user interface, memory or registers, and one or more comparators. It is contemplated that the digital control module may be configured to evaluate the up_dn signal in relation to a threshold value and, responsive to the evaluation increase or decrease the control vector by a step max value or adjust the control vector up or down small step size. In another variation, the digital control module evaluates past values of the up_dn signal to adjust a step size value such that the step size signal controls the rate of change of the control vector, and based on the up_dn signal increasing or decreasing the control vector by the step size value.

Also disclosed is a method for controlling gain of a variable gain amplifier based on a control vector value comprising monitoring a variable gain amplifier output signal to create a monitor signal and comparing the monitor signal to a target value to create an up_dn value, the up_dn value indicating whether the monitor signal is greater than or less than the target value. Then, evaluating the up_dn values for changes in the up_dn value over a predetermined number of up_time values. Responsive to the changes in the up_dn value over a predetermined number of up_time values, reducing a step size value. Responsive to zero or less than a certain number of changes in the up_dn value over a predetermined number of up_dn values, increasing a step size value. Then, increasing the control vector value by the step size value if the monitor signal is greater than the target value or increasing the control vector value by the step size value if the monitor signal is greater than the target value? Thereafter, adjusting the gain of the variable gain amplifier based on the control vector value. In this embodiment, decreasing the control vector value increases the gain and increasing the control vector value decreases the gain. However, in other embodiment, other relationships may be established between the control vector value and the gain and thus the claims and disclosure is not limited to a particular set relationship.

In one embodiment, this method further comprises converting the control vector value to an analog control signal and providing the analog control signal to the variable gain amplifier. The step of monitoring the variable gain amplifier output signal may comprise determining a peak value of the variable gain amplifier output signal. In one configuration, the up_dn signal is either a logical "0" value indicating that the variable gain amplifier output signal is less than the target value or a logical "1" value indicating that the variable gain amplifier output signal is greater than the target value. The step size value has a maximum value which determines the maximum rate of change of the control vector value. In one example embodiment, the predetermined number of up_dn values is ten, reducing the step size value reduces the step size value by half, and increasing the step size value doubles the step size value.

Also disclosed is a method for controlling convergence of an automatic gain control unit comprising receiving an input signal and adjusting the peak to peak magnitude of the input signal with a variable gain amplifier (VGA) based on a control vector. In this method the VGA generates a VGA output signal. Then, processing the VGA output signal with a peak detector to determine a peak value of the VGA output signal and comparing the peak value to a target value. Responsive to the comparing, determining if the peak value is greater than or less than the target value and responsive to the comparing determining if the peak value is less than the target value then performing the following. Comparing the peak value to the target value to determine if the peak value is less than the target value by a threshold value, responsive to the peak value not being greater than the target value by a threshold value, determining if the control vector is at the minimum value. Responsive to the control vector being at the minimum value then not changing the control vector. Alternatively, responsive to the control vector not being at the minimum value, decreasing the control vector by first amount.

The threshold values are controlled by the analog circuit and not under digital control. In one embodiment, the threshold values programmable, but in other embodiments the values are fixed. The thresholds should be programmed to assert up_max and dn_max when the output signal amplitude is significantly wrong. The "up_max" should be asserted when the control vector should be significantly increased. The "dn_max" should be asserted when the control vector should be significantly reduced.

This method also includes, responsive to the comparing determining if the peak value is greater than the target value by the threshold value, determining if the control vector is within a step max value of a minimum control vector value. Responsive to the control vector being within a step max value of a minimum control vector value, decreasing the control vector to the minimum control vector value. Otherwise, responsive to the control vector being greater than the step max value from the minimum control vector value, decreasing the control vector by the step max value.

In this method, responsive to the comparing determining if the peak value is greater than the target value, comparing the peak value to the target value to determine if the peak value is less than the target value by a second threshold value. And, responsive to the peak value not being greater than the target value by a second threshold value, determining if the control vector is at the maximum value. Responsive to the control vector being at the minimum value, not changing the control vector, and responsive to the control vector not less than the maximum value, increasing the control vector by first amount.

This method also includes, responsive to the comparing determining if the peak value is greater than the target value by the second threshold value, determining if the control vector is within a step max value of a maximum control vector value. Then, responsive to the control vector being within a step max value of a maximum control vector value, increasing the control vector to the maximum control vector value, or responsive to the control vector being greater than the step max value from the maximum control vector value, increasing the control vector by the step max value.

In one embodiment the second amount is greater than two steps. In one configuration, the control vector controls the gain of the VGA. The step max value is a maximum amount that the control vector can be changed at a time.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 8A is an index figure showing the relationship of FIG. 8B and FIG. 8C.

FIG. 8B illustrates a first portion an operational flow chart of an alternative method of control vector adjustment.

DETAILED DESCRIPTION

Figure 1:
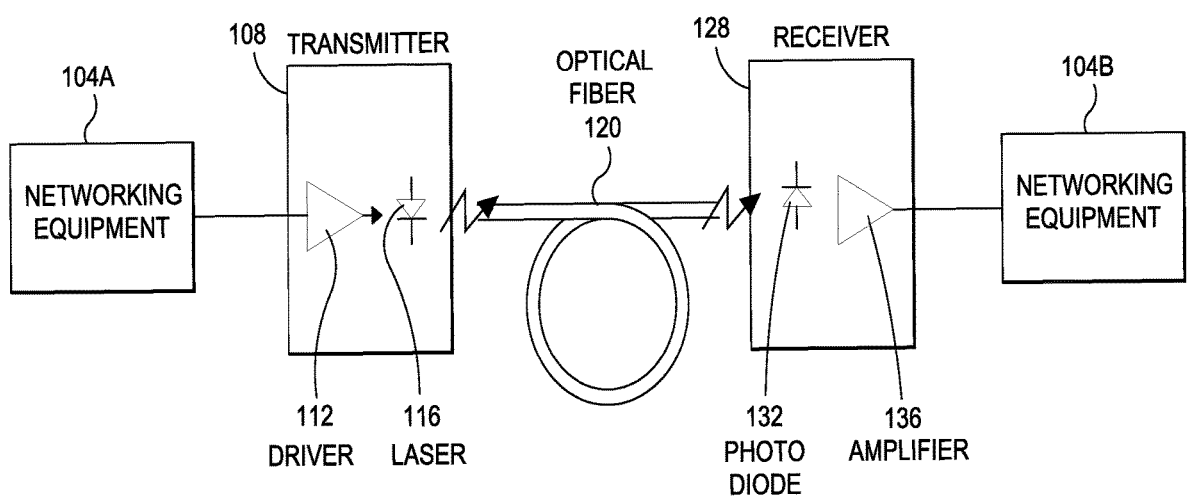
FIG. 1 illustrates an exemplary optic fiber communication link.

One example environment of use is in an optic communication system that utilizes optical fiber links and lasers or some other form of optic signal generator (light source). Although shown in an optic communication system, it is also contemplated that the system may be electrical and utilized as an electrically conductive channel. FIG. 1 illustrates an exemplary optic fiber communication link. To enable communication between remote networking equipment 104A, 104B a fiber optic transmitter and receiver is provided. Laser drivers 112, part of a transmitter 108, drive the lasers 116 with a modulating current which produces modulating optical output from lasers. This optical output is coupled into the optical fiber 120 for signal transmission. At the receive side of the optical fiber link is a receiver 128. Optical energy is converted into electrical signals by a photodiode 132 and processed further by an amplifier 136 to set the signal magnitude to a level suitable for downstream processing elements. It is contemplated that the innovation disclosed herein may be used in other environments or that this environment of use may vary from that shown.

Figure 2A:
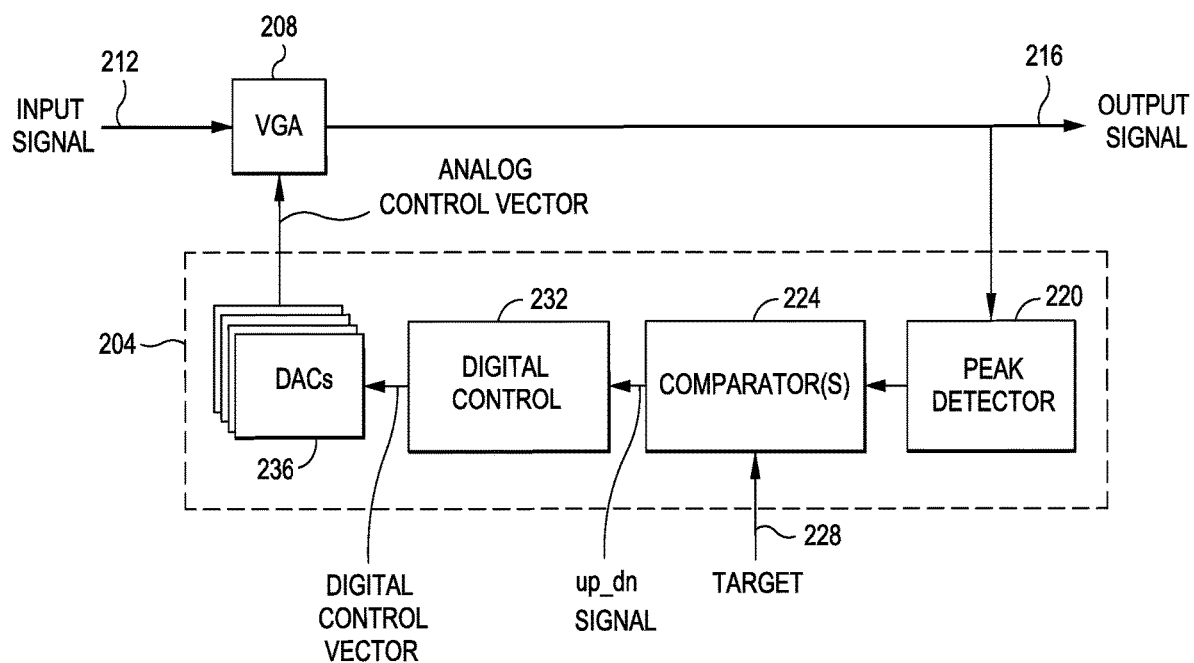
FIG. 2A illustrates a block diagram of an exemplary variable gain amplifier control system.

FIG. 2A illustrates a block diagram of an exemplary variable gain amplifier control system. This is but one possible configuration and it is contemplated that other embodiments are possible without departing from the scope of the invention. In this embodiment, the control system 204 provides analog control signals to the VGA (variable gain amplifier) 208 to control the gain of the VGA. An input signal is provided from an input terminal 212 to the VGA 208. The input signal may be provided from any device or system, such as but not limited to a photodetector. The input signal is amplified (or de-amplified) and presented as an output signal on an output terminal 216. The amount of amplified (or de-amplified), also referred to as gain, is determined by the control signal.

The VGA control system 204 is configured with a peak detector 220 that receives the output signal from the output terminal 216 as shown. Although shown and described herein as a peak detector, any aspect of the signal may be detected, such as but not limited to magnitude, average, peak values may be detected. The peak detected may be any type monitor or detector. The peak detector 220 analyzes the output signal and generates a value which represents the peak amplitude (signal magnitude) of the output signal. In other embodiments, devices other than a peak detector may be used. Peak detectors 220 are generally known in the art and hence not described in detail herein. In this embodiment the peak detector 220 may also convert the signal to a digital format and thus may include one or more analog to digital converter. In some embodiments the peak detector is not includes or part of the comparator 224.

The output of the peak detector 220 feeds into a comparator 224. Although shown as one comparator 224, the comparator could be one or more comparators. The comparator 224 compares the signal magnitude from the detector 220 to a target value 228. The target value 228 is a value that represents a desired signal magnitude that is best suited for downstream processing of the output signal. The target value may be programed and changed by a user using a user interface or fixed. The target value may be stored in a memory. In this example embodiment, the comparator 228 provides a logic level output of a '0' or a '1' logic value. In the discussion herein, the output of the comparator 228 provides a comparator output signal that indicates the results of the comparison. For purposes of discussion, this signal is referred to as an up_dn signal such that logic '0' value indicates that the output signal is less than the target value, and logic level '1' value indicates that the output signal is greater than the target value. When the output signal is less than the target magnitude, the function of the VGA control system 204 is to increase the gain of the VGA 208 which in turn increases the magnitude of the output toward the target value. Gain of the VGA is increased by decreasing a control vector (digital control value). Conversely, when the output signal is greater than the target magnitude, the function of the VGA control system 204 is to decrease the gain of the VGA 208 which in turn decreases the magnitude of the output toward the target value. Over time, the output signal magnitude will approach and be at the target value. The output of the comparator 224 is defined as the up_dn signal which indicates whether the gain should be increased or decreased.

The comparator output feeds into a digital control unit 232. The digital control unit 232 includes one or more logic elements, registers, memory, or other elements configured to process the up_dn signal from the comparator 224 to generate a control vector. The control vector is a digital value that represents gain such that increasing the control vector decreases gain and increasing the control vector decreases gain. In other embodiments or configurations, different relationships between the gain and control vector may be established. During each clock cycle or sample period the gain may be increased a small amount, a single step, or a large amount, such as many steps. It is contemplated that during a cycle, or recurring time periods, the output signal is sampled by the detector thus resulting in new up_dn signals being created over time.

The control vector from the digital control unit 232 is provided to one or more digital to analog converters (DACs) 236. The DACs 236 convert the control vector from a digital format to an analog format which is suitable for injection into the analog VGA 208 to control the gain. The digital control vector and DACs are configured with high resolution which is determined by the number of steps between the minimum and maximum control vector values. For example, there may be 1000 or more steps between minimum and maximum control vector values. The greater the resolution, i.e. number of digital steps between a maximum and minimum control vector values, the greater the ability to control the gain of the VGA and the output signal magnitude. It is generally preferred to have high degree of output signal magnitude control for accuracy, thus requiring a large number of steps in the digital control vector and DACs 236. However, if a large number of steps are available, then it will take a greater number of cycles to change from a high gain state to a lower gain state.

Figure 2B:
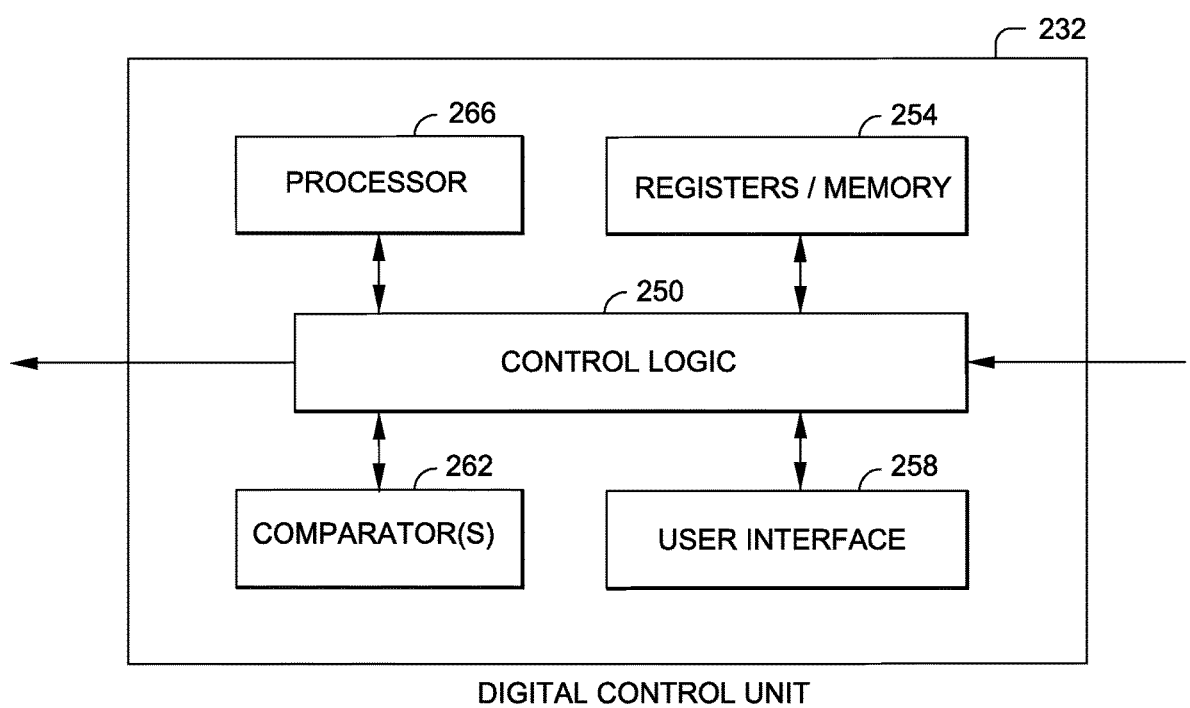
FIG. 2B illustrates a block diagram of an exemplary digital control unit.

FIG. 2B illustrates an example embodiment of the digital control unit shown in FIG. 2A. This is but one possible configuration of elements and other elements or arrangements may be used without departing from the innovation. The digital control unit 232 includes control logic configured to process the received signal as described herein and interact with one or more other elements of the digital control unit. In various embodiments, not every element shown in FIG. 2B will be included. Also, part of the digital control unit 232 are data storage registers and/or memory 254. The data storage registers and/or memory 254 can store the up_dn signal, max_step, step_size values, or any other data, or machine-readable code, such as software. A processor may also be part of the digital control unit 232 configured to execute machine readable code stored in a non-transitory state in the memory 254 to perform the functions described herein. The functions may be alternatively or in part, performed by the control logic 250.

A user interface 258 is provided in the digital control unit 232 to provide access for a user to set or change one or more of the values stored in the registers/memory 254 or update the software/machine readable code, or perform any other function to effect operation or adaptation of the system. It is contemplated that the functions described herein may be executed in hardware using control logic and registers, software executed in the processor 266, or a combination of both. One or more comparators 262 are also provided as discussed herein to compare the various values. In some embodiments, the comparators 262 may be replaced by the comparators 224 as shown in FIG. 2A or be software functions.

One challenge presented with systems that adjust the gain concerns the rate of change of the gain change over time. While it is possible to increase or decrease the gain by a large amount during a clock cycle, doing so is generally undesirable because large sudden changes in the gain disrupt the signal thereby disrupting downstream signal processing and decoding which in turn introduces errors thus peaking the bit error rate.

At the same time, changing the gain too slowly also presents several disadvantages. One such disadvantage presents itself during training. During training the system is adapting to an unknown channel and as such the gain may need to be increased by a large amount. If the rate of change of the gain is slow, such as due to having a high number of steps in the digital control vector between minimum and maximum values, then the VGA may take an excessive amount of time to present an output signal with a magnitude that matches the target value. If this occurs, the system will not complete training during the set training period and downstream system training will also be delayed or fail. The following discussion focuses on the comparator 224 and digital control unit 232 operation to enable various routines for control vector generation and adaptation that overcomes the drawbacks of the prior art.

Stated another way, the digital controller 232 drives a number of output signals to an array of small digital-to-analog (DAC) circuits 236. In other embodiments, a single output may be provided to a single DAC. In this example embodiment, the DACs 236 are 6-bit DAC circuits that work together to define the gain of the (VGA) 208. The digital control unit 232 decides how the multiple DACs 236 work together in the system based on the value of a wider 11-bit loop control vector. In this embodiment, the automatic gain control (AGC) loop has 2018 (0-2017) unique values for the loop control vector. In other embodiments the control vector may have a different number of unique values. The number is a function of the number of DACs 236 and the number of unique values for each DAC. The control loop is updated at a relatively slow speed, intentionally, to reduce the chance of disturbing the data path with its motion. As a result, in prior art systems a lot of time can be consumed ramping the control vector to its convergence point.

Figure 6:
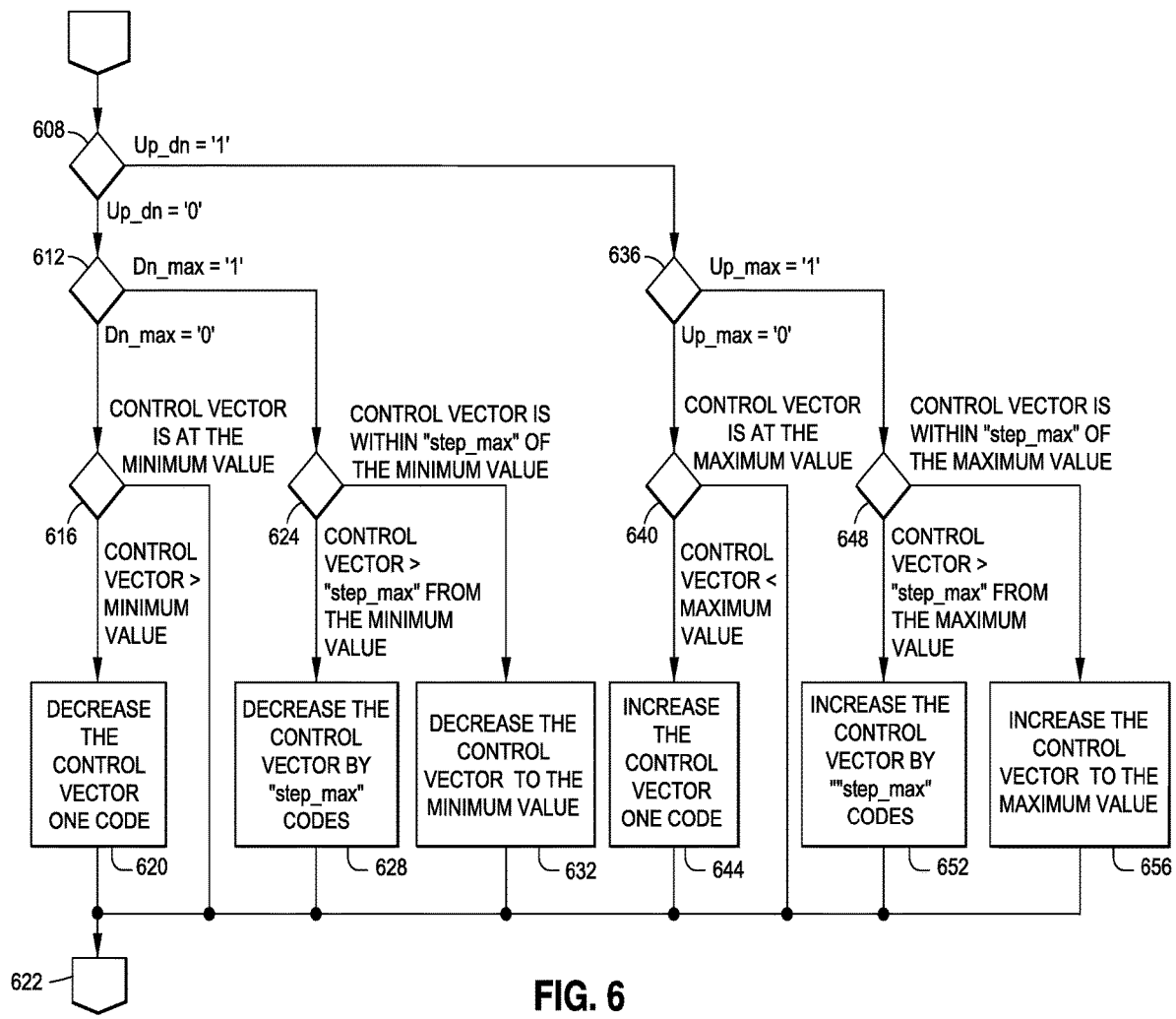
FIG. 6 illustrates an operational flow diagram of a VGA control method.

In the embodiment of FIG. 6, there are three input signals ("up_max", "dn_max", and "up_dn") which instruct the digital control loop how to adjust the control vector. These signals are produced by a comparator that compares the actual signal strength (such as peak) with a pre-defined target. A peak detector is (most likely) used to measure the signal strength of the output waveform. The purpose of the closed-loop system is to ensure the output signal strength is predictable no matter how strong or weak the input signal (within limits of course).

Figure 3:
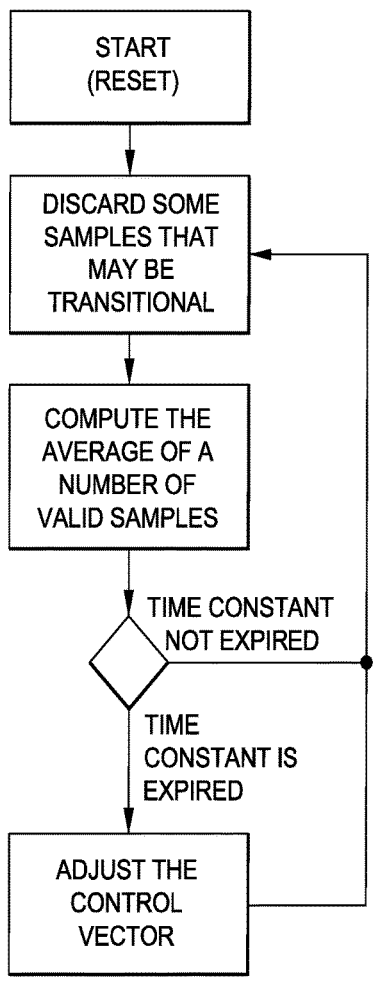
FIG. 3 illustrates prior art method for control vector adjustment.
Figure 4:
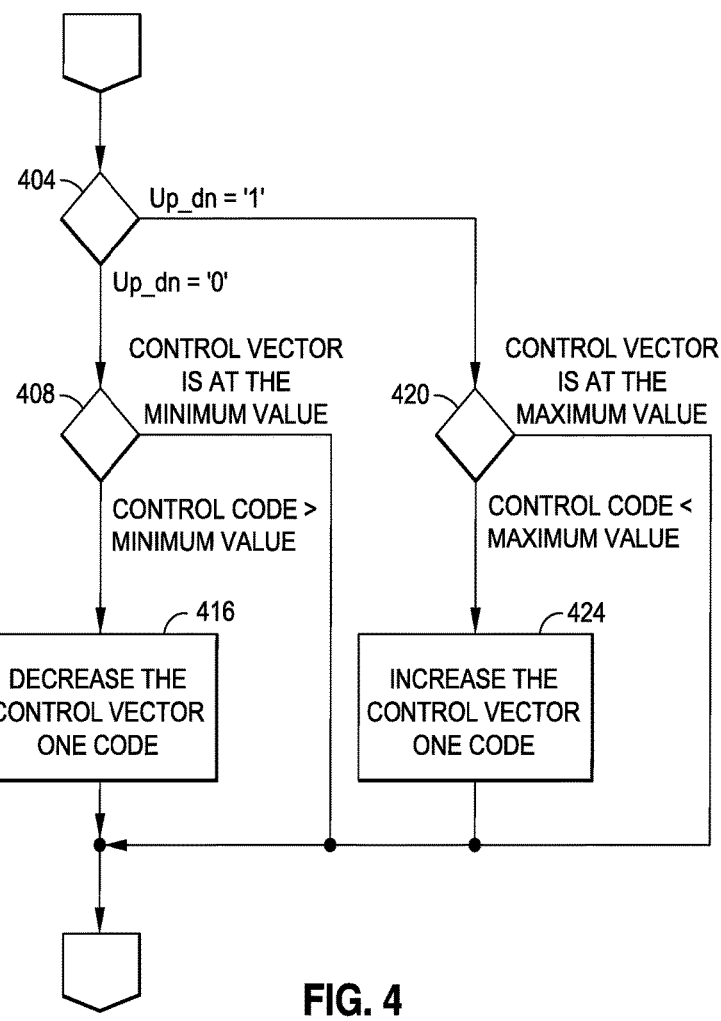
FIG. 4 is a more detailed version of a prior art process of adjusting the control vector.

Before discussing FIG. 6, FIGS. 3 and 4 are discussed. FIG. 3 illustrates a prior art method for control vector adjustment. The method of FIG. 3 starts at a step 304 and by collecting samples but then, at step 308, discards some samples which are transitional or outside of an average range. At a step 312 the system computes the average number of valid samples. Next, at a decision step 316, this method of operation evaluates whether a time constant or time period has expired. If not, then the operation returns to collect more samples and continue to calculate the average value. Once the time period expires, then the samples are compared to the target value and a control signal adjusts the control vector, at step 320, which in turn adjusts the gain of the VGA. It is also contemplated that the host controller may disable the automatic loop and instead set the gain manually. In this embodiment, the digital control unit does not change the gain automatically. It is assumed that any automatic adjustments originate from the host controller. While this method of operation is functional, it lacks the benefit of real time tracking and gain adjustment.

FIG. 4 is a more detailed version of a prior art process of adjusting the control vector. Starting at a step 404, the digital controller determines if the up_dn signal is a logic 0 or 1, i.e. if the output signal is less than or greater than the target value. If the up_dn signal is a 0 value then the control vector should be reduced and the operation advances to decision step 408. At decision step 408 the digital controller determines if the control vector is at the minimum value. If the control vector is at the minimum value then the operation advances to the end and no changes are made to the control vector. Alternatively, if at step 408 the control vector is not at the minimum value, then the control vector is reduced by one unit or increment. The term control vector and control code may be used interchangeably.

Alternatively, if at step 404 the up_dn signal is a logic 1 value indicating that the control vector should be increased, then the operation advances to decision step 420. At decision step 420, the control logic determines if the control vector is at the maximum control vector value. If so, the operation ends without making any changes to the control vector since it is already at its maximum value. Alternatively, if at step 420 the control vector is not at its maximum value, then the operation advances to step 424. At step 424 the digital controller increases the control vector by one step. In this example embodiment, the analog system is designed such that the maximum control vector code corresponds to the lowest gain and the minimum control vector code corresponds to the highest gain. In other embodiments, other relationships may be established without departing from the scope of the claims. When the up_dn signal is at logic level 0 it indicates that the signal strength is less than the target and thus the system should increase the gain (by lowering the control vector code).

In this example method of operation, the control vector is adjusted automatically based on the up_dn feedback signal from the analog portion of the loop. The control vector changes only one unit or increment at a time using single-steps, reducing the chance of disturbing the data path. If the data path is already disturbed by a sudden change in input signal, the slow control loop may take a long time to adjust to the new equilibrium thereby causing the training phase to time out before ideal gain convergence is achieved. Using single steps prolongs this disturbance.

Figure 5:
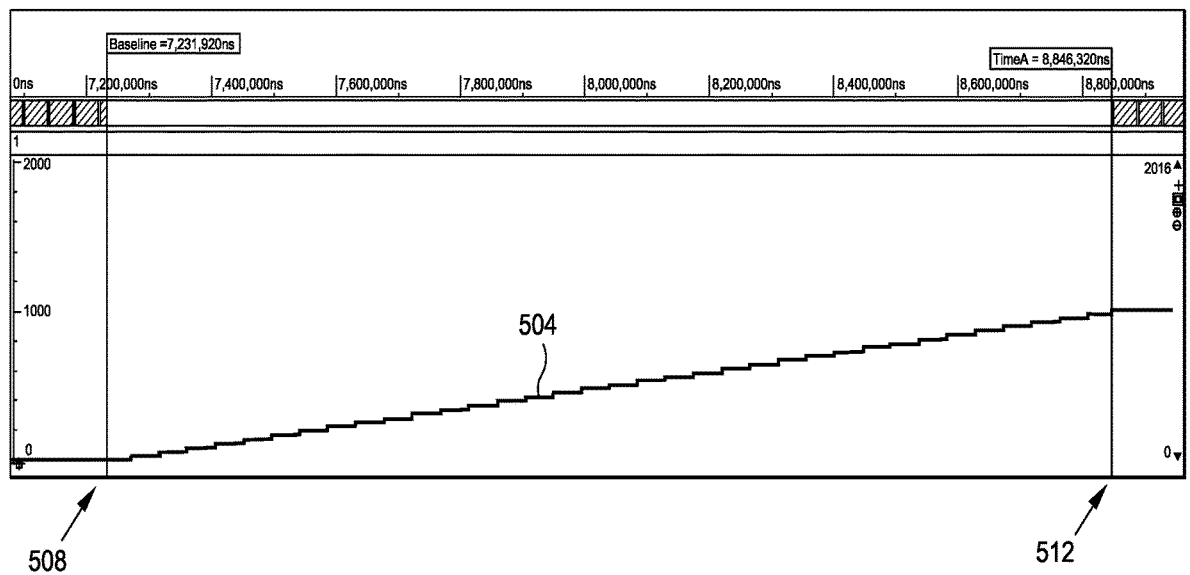
FIG. 5 illustrates an example plot of the control vector value versus time for the method of FIG. 4.

FIG. 5 illustrates an example plot of the control vector value versus time for the method of FIG. 4. The vertical axis represents the control vector value while the horizontal axis represents time. As can be seen in this plot 504, the control signal increases over time, starting at a first time 508 until a second time 512, to reach the desired gain level. Using single steps as shown, 1009 loop iterations are required to re-acquire equilibrium in this example. The settling time is so long because the control vector needed to traverse many steps to reach the new equilibrium point. This number of steps and this amount of time is too long to be completed during a training period.

While the prior art method discussed in FIG. 4 was suitable for prior art environments, it suffers from several drawbacks in VGA control system which have high resolution of gain control and/or which require other than slow acquisition of the output signal to the target value.

FIG. 6 illustrates an operational flow diagram of a VGA control method. This is but one possible method of operation and deviations from this exact method are contemplated which do not depart from the innovation disclosed herein. In general, this method of operation utilizes a control loop with three comparators. The comparators compare the output signal to a target value to determine if the output signal is greater than or less than the target value and the resulting comparison results in the up_dn signal. A second comparator compares the output signal to the target value to determine if the output signal is greater than the target value by a first threshold value. The second comparator outputs a Dn_max signal in response to the comparison. The Dn_max signal is a logic value output of 0 or 1. A logic value 0 indicates that the output signal is not greater than the target by the first threshold value. A third comparator compares the output signal to the target value to determine if the output signal is less than the target value by a second threshold value. The third comparator outputs an Up_max signal in response to the comparison. The Up_max signal is a logic value output of 0 or 1. A logic value 0 indicates that the output signal is not less than the target by the second threshold value. The first and second threshold values may be the same or different values but are assumed to be greater than one. The second comparator outputs a Dn_max signal in response to the comparison. Thus, during operation, three control signals are generated, namely, the up_dn signal, Dn_max signal, and the Up_max signal.

Using these values, the control vectors can be adjusted, in certain situations, by greater than one step at a time. In particular, if the comparison between the output signal magnitude and the target value reveals that the output signal magnitude differs from the target value by an amount greater than the first threshold or the second threshold, then that is an indication that the output signal is far from the target value by an amount greater than the threshold value. When this occurs, it is an indication that the control vector should be moved by more than one increment and, consequently, the control value is increased or decreased by a number of increments defined as the max_step value. The max_step value is a user settable value that is stored in a memory or a register. The max_step value is a value that defines how many units or increments the control value will be increased or decreased when the output signal is greater than or less then the target value from the threshold amount. FIG. 6 provides a more detailed description of this method of operation.

This method of operation starts at a step 604 where a comparison occurs between the output signal (the peak value of the VGA output), and the target value. Decision step 608 occurs such that the comparator output signal (the up_dn signal) from the comparator is detected and analyzed by the digital control unit. If the up_dn signal is a logic 0 value (meaning the peak value is less than the target value) then the operation advances to decision step 612. This may be generally defined as the path that decreases the control vector. At decision step 612 the comparators determine if the output signal is greater than the target value by a threshold value. If at decision step 612 output signal is not greater than the target value by a threshold value, then the Dn_max signal is set to logic level 0 and the operation advances to decision step 616.

At decision step 616 it is determined whether the control vector is already at its minimum value, and thus cannot be further reduced. If the control vector is at its minimum, the process advances to step 622 and ends, although the monitoring and comparing of the output signal to the target value continues over time to provide real time and dynamic gain control.

Alternatively, if at step 616 the control vector is greater than the minimum value the operation advances to step 620. At step 620, the control system adjusts (decreases) the control vector by one and the VGA gain is adjusted downward by one unit or increment.

Alternatively, if at step 612 the comparator determines that the output signal is greater than the target value by the threshold value, then the Dn_max signal is set to logic level 1 and the operation advances to decision step 624. At decision step 624, if the control vector is within the max_step number of increments of the minimum control vector value, then operation advances to step 632 and the control vector is decreased to the minimum value and the operation thereafter ends at step 622 but monitoring continues.

Alternatively, if at decision step 624 the digital control unit determines that the control vector value is greater than the step_max value from the minimum value, the control vector is decreased by the step_max value. This occurs at step 628. Hence, the control vector is decreased by more than one unit or increment since the step_max value is much larger than one, such as for example 10 or 20 steps, or any value greater than one. This allows the output signal to reach the target value faster than the prior art system which provides for only one unit of increment during a cycle of the control loop. The step max value is selected such that moving the gain by the max step amount does not disrupts system operation. In one embodiment, this is 1% to 7% of the total number of steps from minimum to maximum control vector values. In another embodiment it is less than 15% of the total. Thereafter, the process advances to the end step 622 and another loop cycle of monitoring and processing occurs.

Alternatively, if at step 608 the comparison of the output signal to the target value determines that the output signal magnitude (such as peak or peak to peak value) is greater than the target value, then the operation advances toward decision step 636. This path of the operation increases the control vector. At decision step 636 a determination is made regarding the difference between the output signal and the target signal in relation to the Up_max signal. As discussed above, the Up_max signal is a value that determines whether the difference between the output signal and the target signal is so great that the change in the control vector should be greater than one unit or step. If the difference between the output signal and the target signal (the differential) is less than the up_max value (threshold), then the logic output of the comparator performing this comparison is a logic 0 and the operation advances to decision step 640.

At decision step 640, a determination is made whether the control vector is at its maximum value or whether the control vector is less than the maximum value. If the control vector is at the maximum value, then the operation advances to end step 622 and no changes are made to the control vector. This occurs because no additional increase can be made to the control vector, it already being at its maximum value.

Alternatively, if at step 640 the control vector is less than the maximum control vector value, the operation advances to step 644 and the control vector is increased by one unit or step. After the increase, the operation advances to step 622 and the loop process repeats. Hence, because the control output signal value (magnitude peak to peak) is not greater than the target value by more than the Up_max value then the gain is close to being correct and thus the control vector should be increased by only one unit or step.

Returning to step 636, if the comparison between the difference between the output signal and the target signal (the differential) is greater than the Up_max value (threshold), then the logic output of the comparator performing this comparison is a logic 1 and the operation advances to decision step 648. At decision step 648 a determination is made in relation to the value of the step_max value and the control current vector value. If at decision step 648 the control vector is greater than the step_max value from the maximum value then the operation advances to step 652 at which point the control vector is increased by the max_step value because it has been determined that the output signal magnitude is far from the target value, thus a large increase in the control vector is needed to increase the rate of convergence. After step 652, the operation advances to step 622 and the loop repeats.

Alternatively, if at step 648 the operation determines that the control vector is within the step_max value of the maximum control vector value, then the operation advances to step 656 and the control vector is increased to the maximum value and this completes the loop iteration at step 622.

The control vector is adjusted automatically based on the "up_max", "dn_max", and "up_dn" feedback from the analog portion of the control loop. The two extra signals provide a way to tell the digital block when the control vector is "way off" the equilibrium. When "up_max" is asserted, the loop moves by a number of steps defined by the control register "step_max". When "dn_max" is asserted, the control vector is reduced by a "step_max" number of steps. Otherwise, the loop moves up or down by single steps according to the "up_dn" input signal. This requires that the analog block decide when the control vector is significantly off target. In one embodiment, this enhanced control option is enabled by the setting "step_mode" register to "01".

Figure 7:
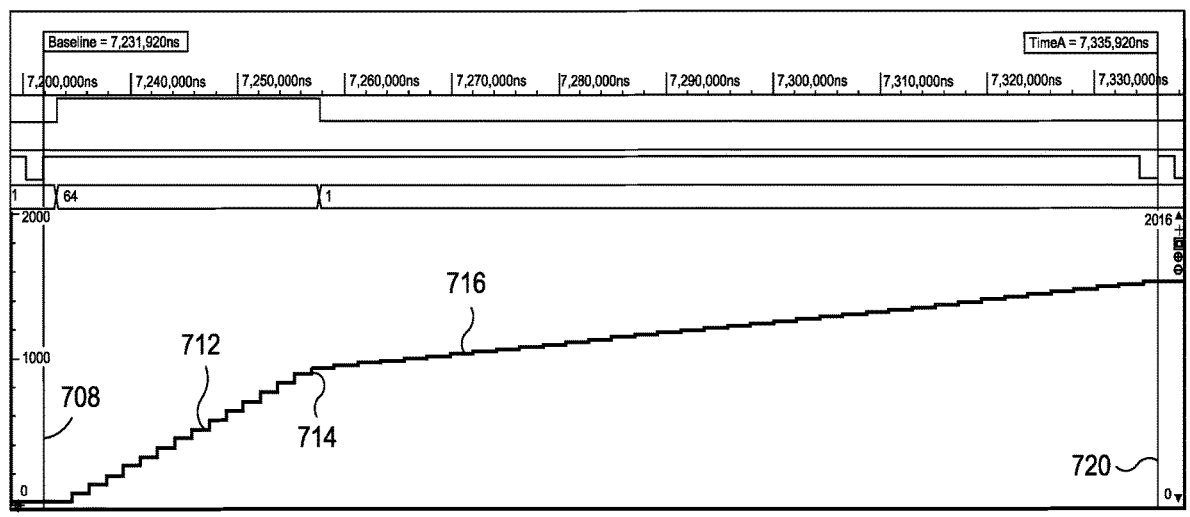
FIG. 7 illustrates a plot of the control vector value over time for the method of FIG. 6.

FIG. 7 illustrates a plot of the control vector value over time for the method of FIG. 6. Control vector value is represented on the vertical axis 730 while time is represented on the horizontal axis 734. At loop start time 708, the loop starts detecting and analyzing the output signal in relation to the target value. During the time period corresponding to the signal plot 712, the system determines that the output signal differs from the target value by a large amount, more than Up_max or Dn_max values so it ramps up the control vector quickly by adding the step_max to the control vector with each loop iteration. At a time 714, the detection system determines that the difference between the output signal and the target value is not so different as to warrant a max_step increase in the control vectors so during the time period for the signal plot section 716 the loop performs a single unit or increment increase in the control vector which results in the small steps in the gain. At time 720, the output signal has reached the target value and the loop has reached equilibrium.

Using multiple step size modes of FIG. 6, only 65 loop iterations are required to re-acquire equilibrium in this example. This is a 93.6% improvement over using single-steps from FIGS. 4 and 5.

Figure 8C:
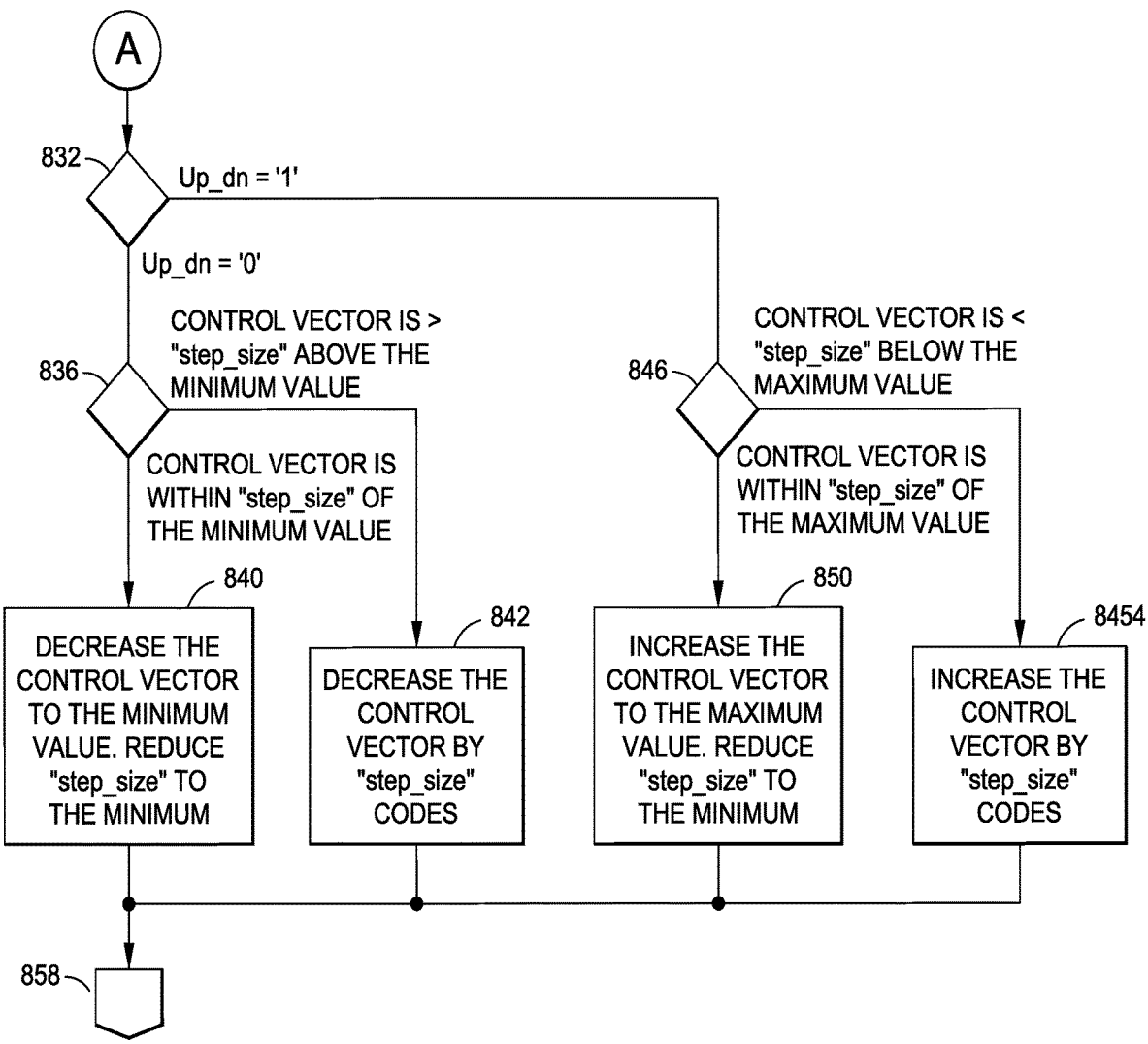
FIG. 8C illustrates a second portion the operational flow chart of the alternative method of control vector adjustment shown in FIG. 8B.

FIG. 8A is an index showing the relationship between FIG. 8B and FIG. 8C. FIG. 8B and FIG. 8C illustrate an operational flow chart of an alternative method of control vector adjustment. This is but one possible method of operation and it is contemplated that other methods of operation may be enabled without departing from the scope of the invention. In this embodiment, the control vector is adjusted automatically based on the "up_dn" feedback signal from the analog portion of the loop. The digital block monitors the history of "up_dn" over time to determine whether the control vector is significantly off target based on the historic value of the up_dn signal. In this embodiment, a shift register or other memory type stores the value of "up_dn" each time the control loop is updated. The oldest value is discarded from the end of the stack while the newest value is inserted at the start. This may be referred to as a first in, first out process. Like in the other embodiments, the up_dn value (signal) is a logic value 0 or 1.

As shown in FIG. 8B, this method of operation starts such that a comparison occurs between the output signal (the peak value of the VGA output), and the target value. The comparison generates the up_dn signal. This process may repeat several times such that the up_dn values are stored in memory/registers. If the value of "up_dn" is not the same N times in a row (where N is a value set by the user within a range of numbers), the control loop has recently crossed its convergence point and the step size is reduced by half. This occurs because changes over time in the up_dn value indicate that the output signal has recently been at or crossed over the target value. This reduction by half of the control vector happens each time the control loop is updated until the step size becomes "step_min" (default 1). The time delay from the digital control unit output back to the "up_dn" input is relatively small so 8 loop iterations are enough to detect multiple crossings. In other embodiments, a different number of iterations may be used. At convergence of the output signal with the target signal, the step size should always be the minimum size. When the up_dn signal does not change over a predetermined number (N) of sample indicates that the step size may be increased or decreased. Reducing the step size by half for every loop iteration causes the step size, and hence control vector to change more slowly over time. For example, if the step size is 128, then halving it results in the step size to be 64 and during the next iteration to be 32, and during the next iteration the step size drops to 16. Thus, in just three cycles the step size has dropped from 128 to 16. This results in a faster rate of change of the control vector but not so fast to disrupt operation. These numbers are exemplary only and the claims are not limited by these numeric values. The step size is the amount the control vector changes, which in turn controls the gain, which in turn controls the output signal magnitude.

The same principles apply with regard to increasing the step size, which doubles when N number of up_dn signals are the same, i.e. logic 1 value. If the N most recent values of the up_dn signal are the same, the step size is doubled. If the up_dn signal does not change, then the step size increases each time the control loop is updated until the maximum step size is reached or until the value of "up_dn" changes. The maximum step size prevents the step size from becoming too large, which could lead to too large of a change in the gain in one step. If the control vector reaches the upper limit while "up_dn" is '1', the step size is immediately reduced to the minimum step size "step_min". If the control vector reaches the lower limit while "up_dn" is '0', the step size is reduced immediately to "step_min". Dynamic step size may be selected by setting the "step_mode" register to "10" (default value).

Returning to FIG. 8B, the operation develops a new up_dn value at the digital control unit and in particular, a data storage register. This method of operation starts at a step 604 where a comparison occurs between the output signal (the peak value of the VGA output), and the target value.

This comparison determines the up_dn value, which is stored in the memory/registers. At a step 808, the digital control unit shifts the newest up_dn value into the register which causes the other values to shift to the left such that the new value is inserted on the right. Next, at decision step 812 the digital control unit determines if the last N number of consecutive values for up_dn, stored in the register, are the same or if the N number of values are different. If the last N values of the up_dn value are not the same, then the operation advances to decision step 816. At decision step 816 a determination is made regarding the step size and whether the step size is at a minimum value or is greater than the minimum value. If at decision step 816 the step size is greater than the minimum step size value, then the operation advances to step 820. At step 820 the step size is reduced by half. In other embodiments the step size may be reduced (or increased) at a rate or amount that is other than half. After step 820, the operation advances to decision step 832, which is discussed in greater detail below on FIG. 8C.

Returning now to step 816, if the step size is at the minimum value, it follows that it cannot be reduced anymore, so the operation advances to decision step 832, discussed below. Returning to step 812, if the up_dn history is such that the history (register) shows N number of consecutive up_dn values which are the same, then the operation advances to decision step 824. At decision step 824 a determination is made by comparing the step size to the step size maximum value. If the step size is at the maximum value, then the operation advances to step 832 and no changes are made to the step size due to it already being at the maximum value. Alternatively, if the step size is less than the maximum value, then the operation advances to step 828 and the step size is doubled, or as stated above, or increased by some value, ratio, or factor. After step 828 the operation advances to step 832.

At decision step 832 (FIG. 8C), the digital control unit determines if the comparison between the output signal and the target value resulted in the up_dn signal being a logic level 0 or a logic level 1. If the up_dn is a 0, meaning the output signal is less than the target value, then the operation advances to step decision step 836 (for eventual reduction of the control vector). At decision step 836 a determination is made whether the control vector is within a step_size value of the minimum control vector value or if the control vector is greater than the step_size by the minimum value.

If the control vector is within a step_size value of the minimum control vector value, then the operation advances to step 840. At step 840, the digital controller unit decreases the control vector to the minimum value and the step_size value is reduced to its minimum also. Thereafter, the value adjustments end at step 858 and the loop reiterates by returning to step 804.

Alternatively, if at step 836 the control vector value is greater than the step_size value above the minimum value, then the operation advances to step 842. At step 842 the digital control unit decreases the control vector by the step_size value (codes). After step 842, the operation ends at step 858 and a new loop iteration occurs by returning to step 804.

Returning to step 832, if the up_dn value is a 1, meaning the output signal is greater than the target value, then the operation advances to decision step 846. At decision step 846, a determination is made regarding whether the control vector is less than the step_size below the maximum value, or if the control vector is within a step_size of the maximum value. If at decision step 846 the control vector is within a step_size of the maximum value, then the operation advances to step 850 and the digital control unit increases the control vector to the maximum value and also reduces the step_size value to the minimum value. Thereafter, the operation ends at step 858 and the loop reiterates by returning to step 804.

Alternatively, if the control vector is less than a step_size value below the maximum value, then the operation advances to step 854 and the digital control unit increases the control vector by a step_size size number of units, also referred to as values, increments or codes. The step size was calculated above at steps 812-828. Thereafter, the operation ends at step 858 and the loop repeats by returning to step 804.

Stated another way, in this example embodiment, the control vector is adjusted automatically based on the up_dn feedback signal from the analog portion of the loop. The digital control unit monitors the history of the up_dn signal over time to determine whether the control vector is significantly off target which in this embodiment is determined by the up_dn signal not changing over N consecutive loop iterations determined by N consecutive up_dn values in a shift register. The shift register stores the value of the up_dn signal each time the control loop is updated. During each iteration, the oldest stored value of the up_dn signal is discarded from the end of the stack while the newest value is inserted at the start. N may be any value, but high values cause the control value to change more slowly.

If the value of the up_dn signal is not the same N times in a row, the control loop has recently crossed its convergence point and the step size is reduced by half. This happens each time the control loop is updated until the step size becomes step_min (default 1). The time delay from the digital output back to the up_dn signal input is relatively small so eight loop iterations are enough to detect multiple crossings of the convergence point. In other embodiments a different number of iterations may be defined (used). At convergence, the step size should always be the minimum size although prior to that the control vector and even the gain may range above and below the target value as the desired gain level is found.

If the N most recent values of "up_dn" are the same, the step size is increased by one. The step size is doubled (or increased by some other increment or factor in other embodiments) when the control loop is updated until the maximum step size is reached or until the value of up_dn signal changes. In this embodiment, the step size equals $2^S$ where S is the step size register which is incremented or decremented. When S increases by one, the step size doubles. When S decreases by one, the step size is cut in half. In other embodiments, other mathematical algorithms may be implemented. If the control vector reaches the upper limit while up_dn is still logic level 1, the step size is immediately reduced to the minimum step size step_min value. If the control vector reaches the lower limit while "up_dn" is logic level 0, then the step size is reduced immediately to the step_min value. In one implementation, the dynamic step size may be selected by setting the step_mode register to "10" (default value).

The N loop iteration delay before increasing the step size gives valuable hysteresis so that instability is avoided. In the embodiment described herein, the step size remains small until 8 loop iterations have elapsed with the up_dn signal equal to 1. During this time, the control vector is being increased by small steps. Once the up_dn signal becomes logic level 0, the step size is immediately reduced, such as by half, of some other value. This asymmetrical behavior reduces the chance that the control vector will alternate by more than the minimum step size (default 1) at convergence. During simulation it was revealed that using dynamic step size mode as described in FIGS. 8A, 8B, only 35 loop iterations are required to re-acquire equilibrium in this example. This is a 96.5% improvement over using single-steps.

Figure 9:
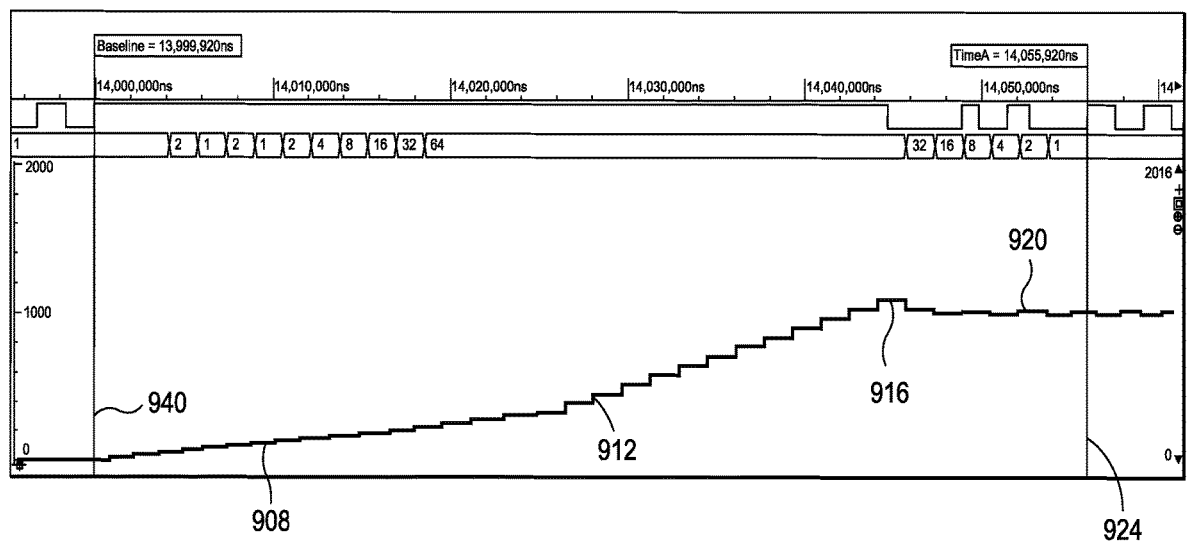
FIG. 9 illustrates an example plot of a control vector adjustment based on the method of FIG. 8B and FIG. 8C.

FIG. 9 illustrates an example plot of a control vector adjustment based on the method of FIGS. 8B and 8C. The vertical axis represents the control vector and the horizontal axis represents time. The control vector signal adjustment process starts at a time 904. During the initial phase, the signal is slowly increasing for the N number of iterations. At signal point 908, the N number of cycles has occurred and the step_size is doubled. In FIG. 9 the step size is shown above the plot and is shown with values, from left to right of 1, 2, 1, 2, 1, 2, 4, 8, 16, 32, 64, 32, 16, 8, 4, 2, 1. The numbers double from 1 to 2 to 4 to 8, etc., until the maximum step size of 64 steps is reached. This progression begins right about marker 908. Once the maximum step size is reached (marker 912), the control vector will be increased by this constant rate based on maximum step size until the convergence point is crossed. The portion of the plot 912 identifies the period when the step size is at its maximum (64). In other embodiments, other maximum steps sizes may be utilized.

Then, at signal point 916 the output signal magnitude has exceeded the target value thereby causing the control vector to begin to decrease. Then, during signal point 920, a state close to equilibrium has occurred and is reached at time 924.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A method for controlling convergence of an automatic gain control unit comprising:
   receiving an input signal;
   adjusting the peak to peak magnitude of the input signal with a variable gain amplifier (VGA) based on a control vector, the VGA generating a VGA output signal;
   processing the VGA output signal with a peak detector to determine a peak value of the VGA output signal;
   comparing the peak value to a target value;
   responsive to the comparing, determining if the peak value is greater than or less than the target value;
   responsive to the comparing determining if the peak value is less than the target value:
      comparing the peak value to the target value to determine if the peak value is less than the target value by a threshold value;
      responsive to the peak value not being greater than the target value by a threshold value, determining if the control vector is at the minimum value;
      responsive to the control vector being at the minimum value, not changing the control vector;
      responsive to the control vector not being at the minimum value, decreasing the control vector by first amount;
      responsive to the comparing determining if the peak value is greater than the target value by the threshold value, determining if the control vector is within a step max value of a minimum control vector value;
      responsive to the control vector being within a step max value of a minimum control vector value, decreasing the control vector to the minimum control vector value;
      responsive to the control vector being greater than the step max value from the minimum control vector value, decreasing the control vector by the step max value;
   responsive to the comparing determining if the peak value is greater than the target value:
      comparing the peak value to the target value to determine if the peak value is less than the target value by a second threshold value;
      responsive to the peak value not being greater than the target value by a second threshold value, determining if the control vector is at the maximum value;
      responsive to the control vector being at the minimum value, not changing the control vector;
      responsive to the control vector not less than the maximum value, increasing the control vector by first amount;
      responsive to the comparing determining if the peak value is greater than the target value by the second threshold value, determining if the control vector is within a step max value of a maximum control vector value;
      responsive to the control vector being within a step max value of a maximum control vector value, increasing the control vector to the maximum control vector value; and
      responsive to the control vector being greater than the step max value from the maximum control vector value, increasing the control vector by the step max value.

2. The method of claim 1, wherein the second amount is greater than two steps.

3. The method of claim 1, wherein the control vector controls the gain of the VGA.

4. The method of claim 1, wherein the step max value is a maximum amount that the control vector can be changed at a time.

5. A method for controlling convergence of an automatic gain control system comprising:
   adjusting a magnitude of an input signal with a variable gain amplifier (VGA) to generate a VGA output signal, the magnitude adjustment by the VGA based on a control vector;
   processing the VGA output signal with a detector to determine a magnitude value of the VGA output signal;
   comparing the magnitude value to a target value;
   responsive to the comparing determining the magnitude value is less than the target value:
      evaluating the magnitude value in relation to the target value to determine the difference between the magnitude value and the target value;
      decreasing the control vector by a first amount, a second amount, or directly to a minimum control vector amount based on the evaluating the magnitude value in relation to the target value;
responsive to the comparing determining the magnitude value is greater than the target value:
evaluating the magnitude value in relation to the target value to determine the difference between the magnitude value and the target value; and
increasing the control vector by a first amount, a second amount, or directly to a maximum control vector amount based on the evaluating the magnitude value in relation to the target value.

6. The method of claim 5 wherein the control vector is increased and decreased in steps and the first amount is a single step and the second amount is a step size greater than a single step.

7. The method of claim 5 wherein the magnitude value is a peak value of the VGA output signal.

8. The method of claim 5 further comprising converting the control vector to an analog control signal, the analog control signal being the control signal that controls gain of the VGA.

9. A system for controlling gain of a variable gain amplifier comprising;
a detector module configured to determine a magnitude of a variable gain amplifier output;
a comparator module configured to compare the peak to a target value and responsive to the comparison, generate an up_dn signal;
a digital control module configured to:
receive the up_dn signal and processes the up_dn signal to generate a control vector; and
evaluate past values of the up_dn signal to adjust a step size value, such that the step size value controls a rate of change of the control vector such that the step size value changes non-linearly;
one or more digital to analog converters configured to convert the control vector to an analog control signal, the analog control controlling the gain of the variable gain amplifier.

10. The system of claim 9 wherein the comparator module consists of three comparators.

11. The system of claim 9 wherein the detector module is configured to detect a peak value of the variable gain amplifier output.

12. The system of claim 9 wherein the digital control module comprises:
control logic;
a user interface;
memory or registers; and
one or more comparators.

13. The system of claim 9 wherein digital control module is configured to evaluate the up_dn signal in relation to a threshold value and, responsive to the evaluation increase or decrease the control vector by a step max value or adjust the control vector up or down by a step size value that is less than the step max value.

14. A method for controlling gain of a variable gain amplifier based on a control vector value comprising:
monitoring a variable gain amplifier output signal to create a monitor signal;
comparing the monitor signal to a target value over time to create an up_dn values, the up_dn values indicating whether the monitor signal is greater than or less than the target value;
evaluating the up_dn values for changes in the up_dn value over a predetermined number of up_time values;
responsive to more than a threshold number of changes in the up_dn value over the predetermined number of up_time values, reducing a step size value;
responsive to less than the threshold number of changes in the up_dn value over a predetermined number of up_dn values, increasing a step size value;
increasing the control vector value by the step size value if the monitor signal is greater than the target value;
decreasing the control vector value by the step size value if the monitor signal is greater than the target value; and
adjusting the gain of the variable gain amplifier based on the control vector value.

15. The method of claim 14 further comprising converting the control vector value to an analog control signal and providing the analog control signal to the variable gain amplifier.

16. The method of claim 14 wherein monitoring the variable gain amplifier output signal comprises determining a peak value of the variable gain amplifier output signal.

17. The method of claim 14 wherein the up_dn signal is either a logical "0" value indicating that the variable gain amplifier output signal is less than the target value or a logical "1" value indicating that the variable gain amplifier output signal is greater than the target value.

18. The method of claim 14 wherein the step size value has a maximum value which establishes a maximum rate of change of the control vector value.

19. The method of claim 14 wherein the predetermined number of up_dn values is 10, reducing the step size value reduces the step size value by half, and increasing the step size value doubles the step size value.

20. A system for controlling gain of a variable gain amplifier comprising;
a detector module configured to determine a magnitude of a variable gain amplifier output;
a comparator module configured to compare the peak to a target value and responsive to the comparison, generate an up_dn signal;
a digital control module, configured to receive the up_dn signal and processes the up_dn signal to generate a control vector, the digital control module comprising control logic, a user interface; memory or registers, and one or more comparators; and
one or more digital to analog converters configured to convert the control vector to an analog control signal, the analog control controlling the gain of the variable gain amplifier.

21. A system for controlling gain of a variable gain amplifier comprising;
a detector module configured to determine a magnitude of a variable gain amplifier output;
a comparator module configured to compare the peak to a target value and responsive to the comparison, generate an up_dn signal;
a digital control module configured to:
receive the up_dn signal and processes the up_dn signal to generate a control vector;
evaluate the up_dn signal in relation to a threshold value and, responsive to the evaluation increase or decrease the control vector by a step max value or adjust the control vector up or down by a step size value that is less than the step max value; and
one or more digital to analog converters configured to convert the control vector to an analog control signal, the analog control controlling the gain of the variable gain amplifier.

* * * * *